United States Patent [19]
Roth et al.

[11] Patent Number: 5,814,868
[45] Date of Patent: Sep. 29, 1998

[54] TRANSISTOR HAVING AN OFFSET CHANNEL SECTION

[75] Inventors: Scott S. Roth; William C. McFadden; Alexander J. Pepe, all of Austin, Tex.

[73] Assignee: Motorola, Inc., Schaumburg, Ill.

[21] Appl. No.: 298,965

[22] Filed: Sep. 2, 1994

Related U.S. Application Data

[62] Division of Ser. No. 95,502, Jul. 22, 1993, Pat. No. 5,374,572.

[51] Int. Cl.$^6$ ............................ H01L 29/76; H01L 29/94; H01L 31/062; H01L 31/113
[52] U.S. Cl. ............................................ 257/393; 257/350
[58] Field of Search ................... 257/60–61, 67, 257/74, 350, 393, 903

[56] References Cited

U.S. PATENT DOCUMENTS

| | | | |
|---|---|---|---|
| 4,752,814 | 6/1988 | Tuan | 357/23.7 |
| 4,907,041 | 3/1990 | Huang | 357/4 |
| 4,928,161 | 5/1990 | Kobayashi | 257/60 |
| 5,039,622 | 8/1991 | Ishihara | 437/41 |
| 5,047,812 | 9/1991 | Pfiester | 357/23.4 |
| 5,047,819 | 9/1991 | Tanaka et al. | 257/350 |
| 5,060,036 | 10/1991 | Choi | 257/350 |
| 5,100,816 | 3/1992 | Rodder | 437/40 |
| 5,109,260 | 4/1992 | Tanaka et al. | 257/61 |
| 5,155,054 | 10/1992 | Itoh | 437/41 |
| 5,156,987 | 10/1992 | Sandhu et al. | 437/40 |
| 5,521,401 | 5/1996 | Zamanaian et al. | 257/67 |
| 5,523,968 | 6/1996 | Kimura | 365/174 |
| 5,567,959 | 10/1996 | Mineji | 257/350 |
| 5,616,934 | 4/1997 | Dennision et al. | 257/903 |
| 5,648,663 | 7/1997 | Kitahara et al. | 257/350 |

FOREIGN PATENT DOCUMENTS 0 457 434  11/1991  European Pat. Off. ...... H01L 29/784

OTHER PUBLICATIONS

Yamanaka, et al.; "A 5.9 $\mu$m2 Super Low Power SRAM Cell Using a New Phase–Shift Litography"; IEDM; pp. 477–480 (1990).
Ikeda, et al.; "A Polysilicon Treansitor Technology For Large Capacity SRAMs"; IEDM; pp. 469–472 (1990).
Huang, et al.; "New Intra–Gate–Offset High Voltage Thin–Film Transistor With Misalignment Immunity"; Electronic Letters; vol. 25, No. 8; pp. 544–545 (1989).
Huang, et al.; "A New Implant–Through–Contact Method for Fabricating High–Voltage TFT's"; IEEE Electron Device Letters;vol. 9, No. 7 pp. 347–349 (1988).
Uemoto, et al.; "A Stacked–CMOS Cell Technology for High–Density SRAM's"; IEEE Transactions on Electron Devices; vol. 39, No. 10; pp. 2359–2363 (Oct., 1992).

Primary Examiner—Stephen Meier
Attorney, Agent, or Firm—George R. Meyer

[57] ABSTRACT

The present invention includes a transistor having a channel region with a first and second section, wherein the sections have lengths that generally perpendicular to one another. The prevent invention also includes the transistor in an SRAM cell and processes for forming the transistor and the SRAM cell. In the embodiments that are described, the first section has a length that is generally vertical and the second section has a length that is generally extends in a lateral direction. The first section may be an undoped or lightly doped portion of a silicon plug. The plug may be formed including an etching or polishing step.

18 Claims, 8 Drawing Sheets

TRANSISTOR HAVING AN OFFSET CHANNEL SECTION

This is a divisional of patent application Ser. No. 08/095,502, filed Jul. 22, 1993, now U.S. Pat. No. 5,374,573.

FIELD OF THE INVENTION

The present invention relates to the field of semiconductor devices, and in particular, to thin-film transistors including their use in memory devices.

BACKGROUND OF THE INVENTION

As component densities in semiconductor devices increase, use of thin-film transistors also increases. Thin-film transistors typically have poor transistor characteristics. One of these characteristics is the leakage current of the device when it is off, which is call "off current." Theoretically, the off current should be zero when the transistor is off. In reality, the off current for a thin-film transistor typically is unacceptably high. The problem is magnified when there are numerous thin-film transistors in a device, such as a static-random-access memory (SRAM). In an SRAM cell, the load transistors may be thin-film p-channel transistors.

To reduce off current in thin-film p-channel transistors, an offset drain region is used. The offset drain region is that portion of the channel region adjacent to the drain but is not directly above or directly below the gate electrode for that transistor. In many transistors with offset drain regions, the offset drain region is nothing more than an extension of the channel region. As used in this specification, the length of a channel region, offset drain region, main channel section of a channel region, and offset channel section of a channel region is the general direction in which current (whether electrons or holes) primarily flows. An offset drain region typically has a length that generally extends in about the same direction as the length of the channel region. Offset drain regions typically use more substrate area than transistors not having an offset drain region. Also, the offset drain regions may complicate interconnect process sequences particularly in SRAMs. Thin-film transistors in SRAMs are typically formed relatively late in the process. If the transistors occupy a large amount of area, bit line, word line, or $V_{SS}$ contacts may be difficult to form.

SUMMARY OF THE INVENTION

The present invention includes a transistor comprising a channel region having a first section and a second section. The first section has a first length that generally extends in a first direction. The second section has a second length that generally extends in a second direction that is generally perpendicular to the first direction. The present invention also includes an SRAM cell having such a transistor and methods of making the transistor and the SRAM cell. The present invention with allows the formation of a transistor with good off-current characteristics without occupying additional substrate area.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIG. 1–6 include cross-sectional views of a portion of a semiconductor substrate illustrating a process for forming a thin-film transistor with an offset channel section in accordance with an embodiment of the present invention.

DETAILED DESCRIPTION OF THE EMBODIMENTS

The present invention includes a transistor comprising a channel region having a first section and a second section. The first section has a first length that generally extends in a first direction. The second section has a second length that generally extends in a second direction that is generally perpendicular to the first direction. The present invention also includes an SRAM cell having such a transistor and methods of making the transistor and the SRAM cell.

Transistor with an Offset Channel Section

Figure 1:
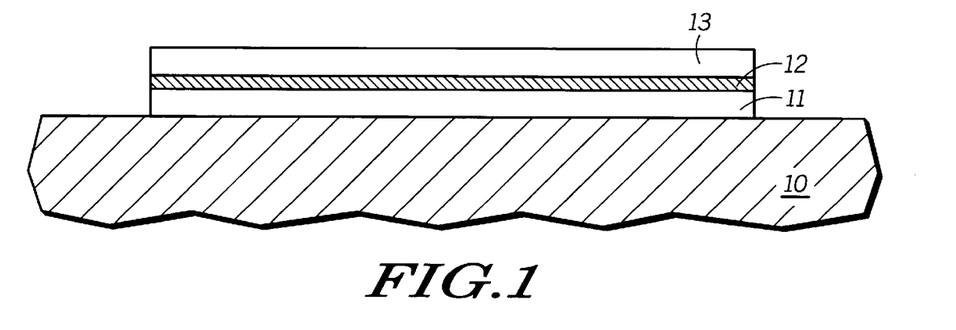

FIG. 1 includes a cross-sectional view of a portion of an insulating substrate 10 with three layers overlying the substrate. A first silicon layer 11 overlies the substrate 10, a dielectric layer 12 overlies the silicon layer 11, and a second silicon layer 13 overlies the dielectric layer 12. The second silicon layer 13 may be undoped or lightly doped. As used in this specification, a lightly doped layer or region means a layer or region having a dopant concentration of no more than 1E17 atoms per cubic centimeter, and a heavily doped layer or region means a layer or region having a dopant concentration of at least 1E19 atoms per cubic centimeter. After layers 11–13 have been sequentially formed, they are patterned as shown in FIG. 1. The patterning of layers 11–13 may be performed during one or more patterning steps, and the shape of layer 11 after patterning may not be completely coincident with layer 13 after patterning.

Figure 2:
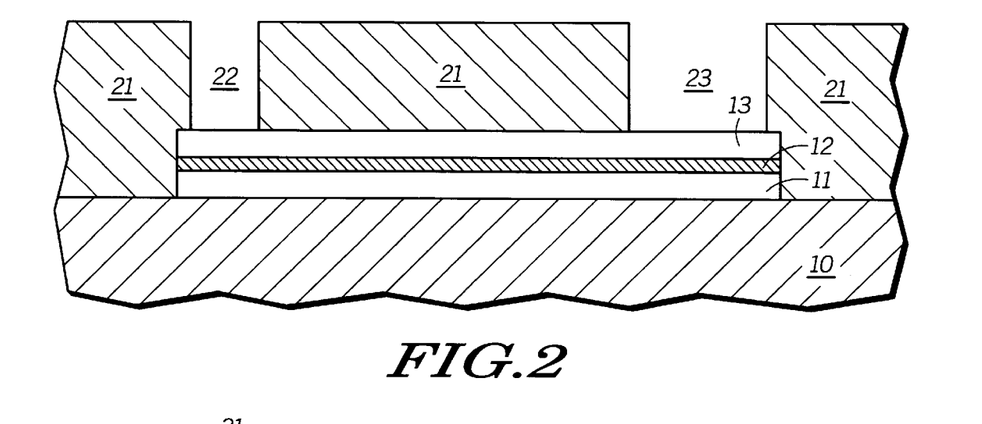

A first insulating layer 21 is formed over the substrate 10 and second silicon layer 13. The thickness of the first insulating layer 21 is about 6000 angstroms thick over silicon layer 13. The thickness of layer 21 may be varied as discussed later in this section. Openings 22 and 23 are formed within the first insulating layer 21 using a conventional method. Although FIG. 2 illustrates substantially vertical walls for the openings 22 and 23, the openings may actually be sloped in another embodiment. The width of opening 22 should be no more than twice as wide as a thickness of a subsequently deposited silicon layer, and the width of opening 23 should be more than twice as wide as the thickness of the subsequently deposited silicon layer. In this example, opening 22 is about 0.5 micron wide, and opening 23 is about 1.0 micron wide.

Figure 3:
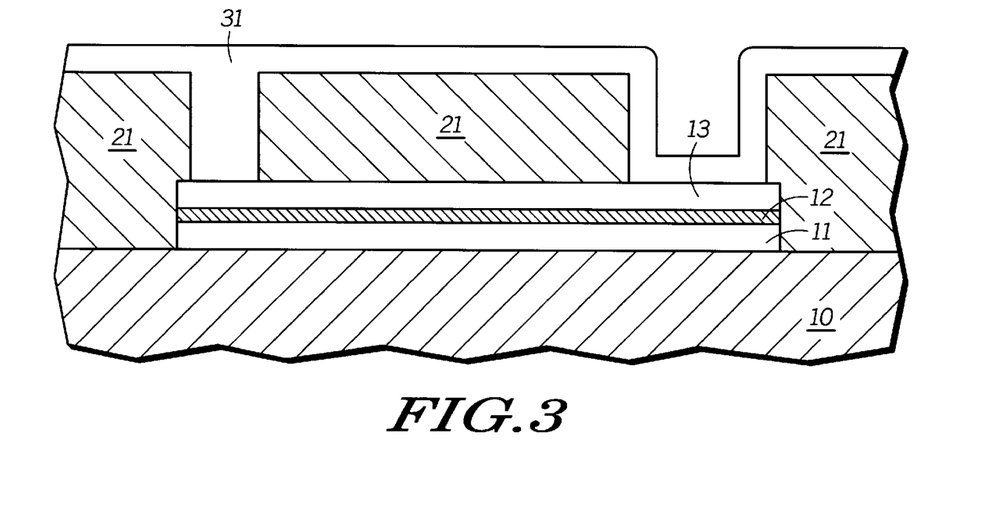

A third silicon layer 31 is deposited to a thickness of about 3000 angstroms over the insulating layer 21 and within openings 22 and 23 as shown in FIG. 3. Opening 22 is filled because it is less than twice as wide (about 0.5 micron) as the third silicon layer 31 thickness (about 3000 angstroms). Opening 23 is not filled because it is more than twice as wide (about 1.0 micron) as the third silicon layer 31 thickness (about 3000 angstroms). In this example, third silicon layer 31 could have been as thin as about 2500 angstroms, but about 3000 angstroms was chosen to allow some process margin.

The third silicon layer 31 is doped by ion implanting a dopant to a dose of at least 1E15 ions per square centimeter and annealing to activate the dopant to form regions 41–44 as shown in FIG. 4. It is noted that regions 41, 42, and 44 are all part of the third silicon layer 31 after the doping and annealing has been performed. Region 43 includes portions of the second and third silicon layers 13 and 31. The annealing may be performed with a rapid thermal processor or a conventional diffusion furnace. The doping and annealing forms heavily doped regions 41 and 43. Portions of the third silicon layer 31 that are not doped are regions 42 and 44. Region 42 acts as an offset channel section of the channel region of the transistor. The length of region 42 is generally determined by the thickness of the first insulating layer 21 and how far the heavily doped region 41 diffuses into opening 22. In addition to ion implantation, the heavily doped regions 41 and 43 could be formed by furnace doping. Although region 44 would not be formed if furnace doping was used, region 42 would still be formed because region 42 would not be directly exposed to the ambient during a furnace doping step.

A tungsten layer 46 is deposited over regions 41–44 shown in FIG. 4. The tungsten layer 46 is etched to remove that portion of the tungsten layer 46 that overlies the first insulating layer 21 and regions 41. Regions 41 are etched to remove that portion of regions 41 that overlie the first insulating layer 21 to form a silicon plug 51 that includes region 42, which acts as an offset channel section, and a contact plug 52 that includes the tungsten layer 46 as shown in FIG. 5. The substrate 10 is further processed to form a substantially completed device as shown in FIG. 6. Interconnects 61 are formed to region 41 and the contact plug 52. Additional layers, contact or via plugs, and interconnects may be needed if the transistor is coupled to other devices (not shown) on the substrate 10. An electrical connection (not shown) is made to layer 11. A passivation layer 62 is formed over interconnects 61 and first insulating layer 21.

In the transistor shown in FIG. 6, layer 11 acts as the gate electrode. The active region of the transistor includes regions 41–44 and layer 13. As used in this application, the main channel section is that portion of the channel region that has a length that generally extends in a direction parallel to the length of the layer or region that acts as the gate electrode. The combination of undoped portion of layer 13 and the left-hand portion of region 44 acts as the main channel section for the transistor shown in FIG. 6. Region 42 acts as the offset channel section of the channel region. Region 42 has a length that is generally perpendicular to the length of the main channel section (undoped portion of layer 13 and left-hand portion of region 44). Regions 41 and 43 act as source/drain regions.

The transistor in FIG. 6 should have good off-current characteristics. Assuming that the transistor is a p-channel transistor, layer 13 is undoped or lightly n-type doped and regions 41 and 43 are heavily p-type doped. With a p-channel transistor, the offset channel section is adjacent to the drain region. Region 41 acts as the drain region and is at a relatively low potential, and region 43 acts as the source and is at a relatively high potential. For example, if region 41 is electrically connected to $V_{SS}$ and region 43 is electrically connected to $V_{DD}$, region 41 would be at about ground potential, and region 43 would be at a potential in a range of about 3–5 volts. The offset (region 42) near the drain (region 41) helps to reduce the off current of the p-channel transistor. If the transistor would be an n-channel transistor, the dopant types and electrical connections would be reversed.

Many benefits are seen with this embodiment. The offset channel section of the channel region has a length that is generally in a vertical direction. By using the vertical direction, an offset channel section has been integrated into the transistor and does not occupy any additional lateral area of the substrate beyond the main channel section of the channel region. As used in this specification, lateral area is an area that lies along a plane that is substantially parallel with the primary surface of the substrate, lateral directions are directions that are substantially parallel with the primary surface of the substrate, and vertical directions are directions that are substantially perpendicular with the primary surface of the substrate. The process for forming the offset is relatively easy to perform and integrate into an existing process for forming a thinfilm transistor. By using different opening widths and choosing the proper thickness of the third silicon layer 31, one can chose whether one side or both sides of a channel region will have an offset.

The present invention is not limited to the embodiment described above. Several thicknesses and opening widths have been given. The specific thicknesses and opening widths have been given to illustrate the invention and are not meant to be limiting. If a main channel section has a length that is relatively vertical, the length of the offset may be in a lateral direction. In any event, the lengths of the main channel and offset channel sections of the channel region are generally perpendicular to each other. The present invention is not limited to the specific dimensions and thicknesses given in the embodiment. The smallest size opening that can be formed may be determined by the lithographic process used in forming the opening. The various silicon layers may be replaced by or used in conjunction with another semiconductor material including silicon, germanium, diamond, and the like. The tungsten layer may be replaced by any conductive material including heavily doped silicon, metals, and metal-containing compounds. The tungsten layer is not required because a portion of a subsequently formed interconnect may fill the portion of the opening 23 that would have been occupied by the tungsten. Although the first insulating layer 21 is shown as being planarized, the first insulating layer 21 does not have to be planarized.

Chemical-mechanical polishing may be used to remove the portions of the regions 41 and tungsten layer 46 rather than the etching. The first insulating layer may need to be planarized prior to depositing the third silicon layer 31 if chemical mechanical polishing is used. The openings 22 and 23, the third silicon layer 31, regions 41–44, and the tungsten layer 46 are formed as described above. Instead of etching, regions 41 and tungsten layer 46 are polished using a conventional chemical-mechanical polishing method. The polishing removes that portion of regions 41 and tungsten layer 46 lying outside of the openings 22 and 23 to form the plugs 51 and 52.

SRAM CELLS

Figure 7:
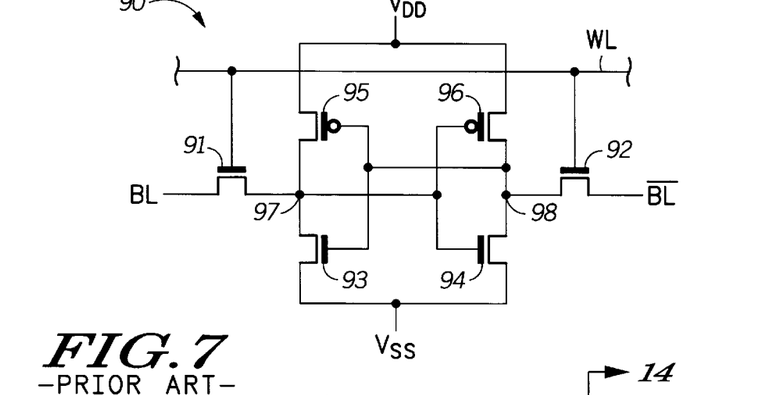
FIG. 7 includes a circuit diagram of a six-transistor SRAM cell. (Prior art)

The present invention is particularly useful in conjunction with an SRAM cell. FIG. 7 includes a circuit diagram of a six-transistor SRAM cell 90. SRAM cell 90 includes two pass transistors 91 and 92, two latch transistors 93 and 94, and two load transistors 95 and 96. The pass and latch transistors 91–94 are bulk n-channel transistors, and the load transistors 95 and 96 are thin-film p-channel transistors. The SRAM cell 90 has a first storage node 97 and a second storage node 98.

Figure 8:
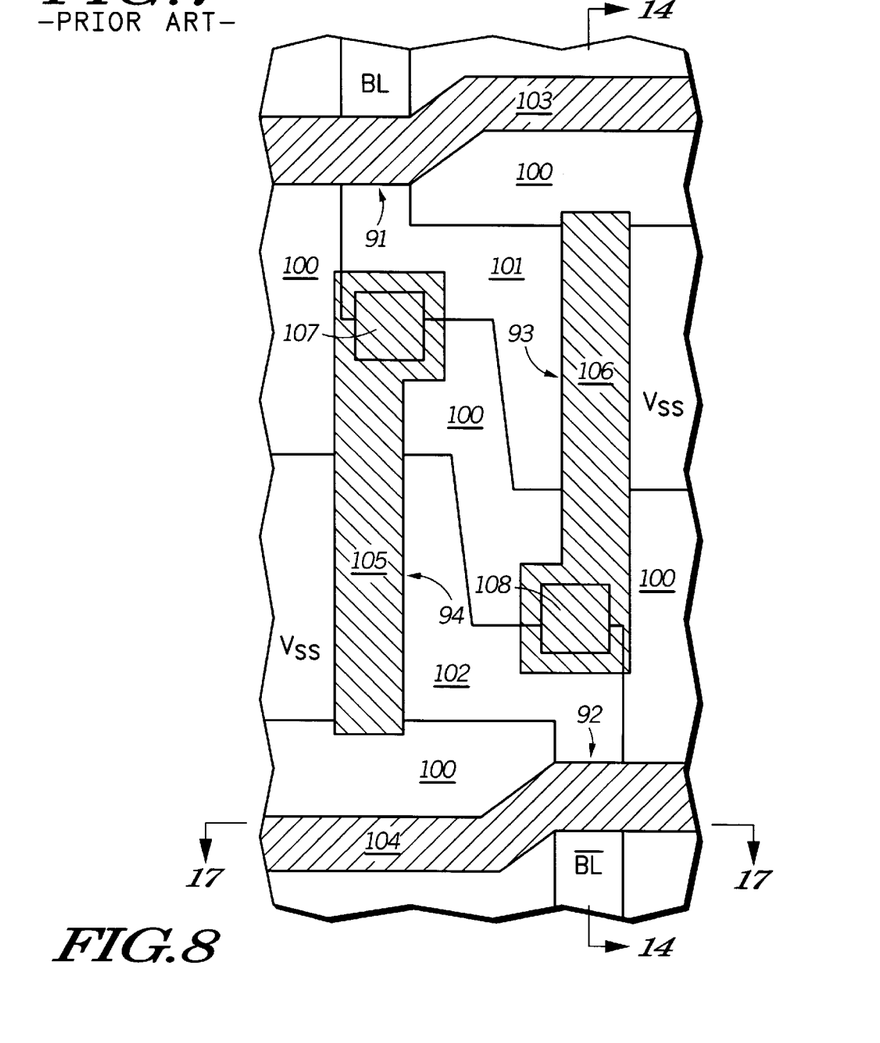
FIGS. 8–13 include top views of a portion of a semiconductor substrate illustrating a process for forming an SRAM cell with a thin-film transistor having an offset channel section in accordance with an embodiment of the present invention.

FIG. 8 includes the SRAM cell layout after forming a first patterned polysilicon layer. The cell has two active regions 101 and 102. The upper portion of the active region 101 and the lower portion of the active region 102 are locations where bit line signals (BL and $\overline{BL}$)enter the SRAM cell. The right-hand portion of active region 101 and the left-hand portion of active region 102 are locations that are electrically connected to $V_{SS}$. The first patterned silicon layer includes members 103–106. The combination of members 103 and 104 act as the word line for the SRAM cell. Pass transistor 91 is formed where member 103 crosses active region 101, and pass transistor 92 is formed where member 104 crosses active region 102. Members 105 and 106 act as gate electrodes for the latch transistors 94 and 93, respectively. The square portion 107 of member 105 represents a buried contact, which is where the member 105 contacts active region 101. Square 108 is similar except it is the buried contact between the member 106 and active region 102. Squares 107 and 108 are hereinafter referred to as buried contacts. Other than at the buried contacts 107 and 108, member 105 and 106 do not contact the active regions 101 and 102. Surrounding active regions 101 and 102 are field isolation regions 100. Portions of the members 103–106 overlie the field isolation regions 100.

The formation of the SRAM cell up to the point shown in FIG. 8 is performed using conventional methods. The field isolation regions 100 are formed within a lightly doped p-type semiconductor substrate to defined the active regions 101 and 102. The first isolation regions 100 may be formed using any conventional field isolation method. Threshold adjusting and other doping steps may be performed to adjust the threshold voltage, increase channel punchthrough voltage, or the like. A first gate dielectric layer (not shown) is formed over the active region. The first gate dielectric layer may include oxide or nitride compounds and may be formed by thermally growth or chemically deposition. A thin silicon layer (about 200–1000 angstroms thick) is deposited after the first gate dielectric layer is formed.

Openings in the thin silicon and first gate dielectric layers are formed where the buried contacts 107 and 108 are to be located. Prior to removing a first masking layer (not shown) used to formed the openings for the buried contacts 107 and 108, the substrate is heavily doped with an n-type dopant to reduce the contact resistance of the subsequently formed buried contacts 107 and 108. The first masking layer is removed after doping. A thick silicon layer (about 1000–3000 angstroms thick) is deposited and heavily doped with an n-type dopant. The combination of the thin and thick silicon layers form the first silicon layer. Only the thick silicon layer contacts the active regions 101 and 102 to form the buried contacts 107 and 108. A second masking layer (not shown) is formed over the first silicon layer. The first silicon layer is the combination of the thin and thick silicon layers and is etched to form the members 103–106. The second masking layer is removed after the members 103–106 are formed.

Figure 9:
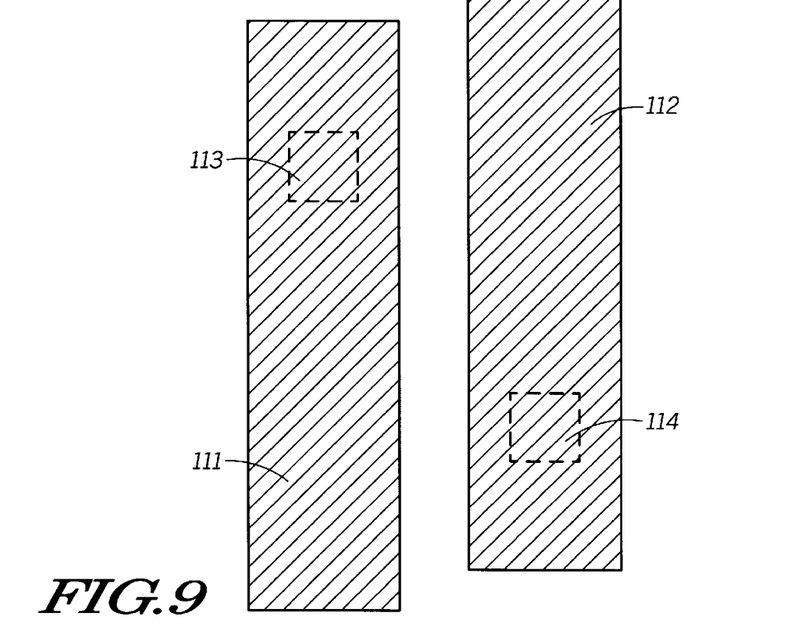

The substrate is heavily doped with an n-type dopant to form doped regions within the active regions 101 and 102. Those portions of the active regions 101 and 102 that are not covered by members 103–106 become heavily doped n-type regions. A first insulating layer (not shown) is formed over the members 103–106. Openings (not shown) are formed within the first insulating layer to expose portions of the active regions 101 and 102 and the members 105 and 106. A second silicon layer about 500–3000 angstroms thick is deposited over the substrate and within the openings. The second silicon layer is heavily doped with an n-type dopant. A third masking layer (not shown) is formed over the second silicon layer, and the second silicon layer is etched to form members 111 and 112 as shown in FIG. 9. The third masking layer is removed after members 111 and 112 are formed. Square 113 represents where member 111 contacts both the member 105 and active region 101, and square 114 represents where member 112 contacts both the member 106 and active region 102. Squares 113 and 114 act as shared contacts and hereinafter referred to as shared contacts. In other embodiments, members 111 and 112 may only contact their respective active regions 101 and 102 or members 105 and 106 because the buried contacts 107 and 108 electrically connect the active regions 101 and 102 to the members 105 and 106. FIG. 9 only illustrates the members 111 and 112 because the members 111 and 112 are separated from underlying conductors by the first insulating layer except at the shared contacts 113 and 114. Members 111 and 112 act as gate electrodes for the subsequently formed load transistors 95 and 96.

Figure 10:
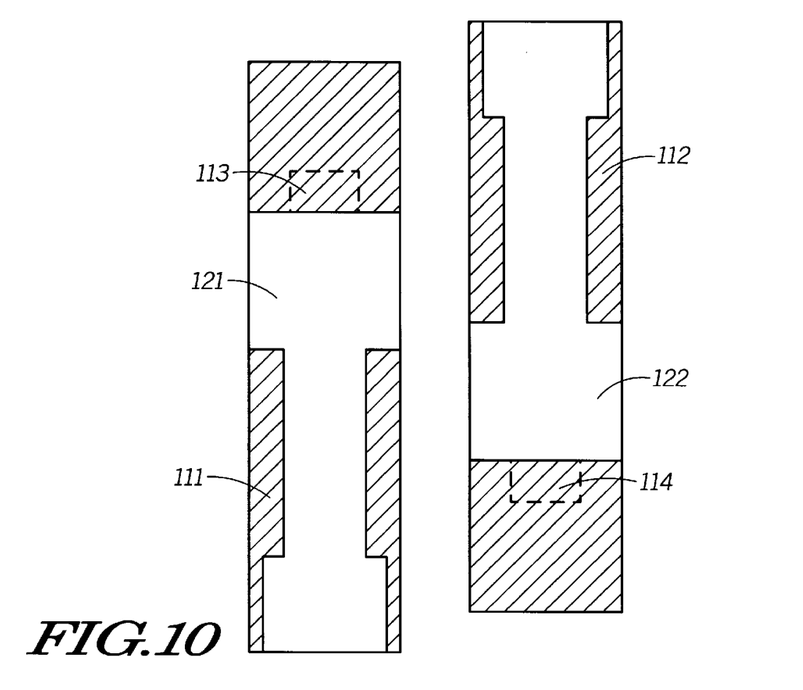

A second gate dielectric layer (not shown) is formed over the members 111 and 112. The second gate dielectric layer may be formed using any one of the methods and materials as the first gate dielectric layer. The first and second gate dielectric layers may include the same material or different materials. A third silicon layer about 200–2000 angstroms thick is deposited over the substrate including the second gate dielectric layer. The third silicon layer is patterned to form members 121 and 122 as shown in FIG. 10. The patterning is performed using any of the methods previously describe for patterning the previous silicon layers. Members 121 and 122 form part of the active region for the load transistors 95 and 96. Members 121 and 122 are not electrically connected to the underlying members 111 and 112 at this point in the process. The portions of the members 121 and 122 that are not subsequently doped to form a source or drain region will be the main channel sections of the load transistors 95 and 96.

Figure 11:
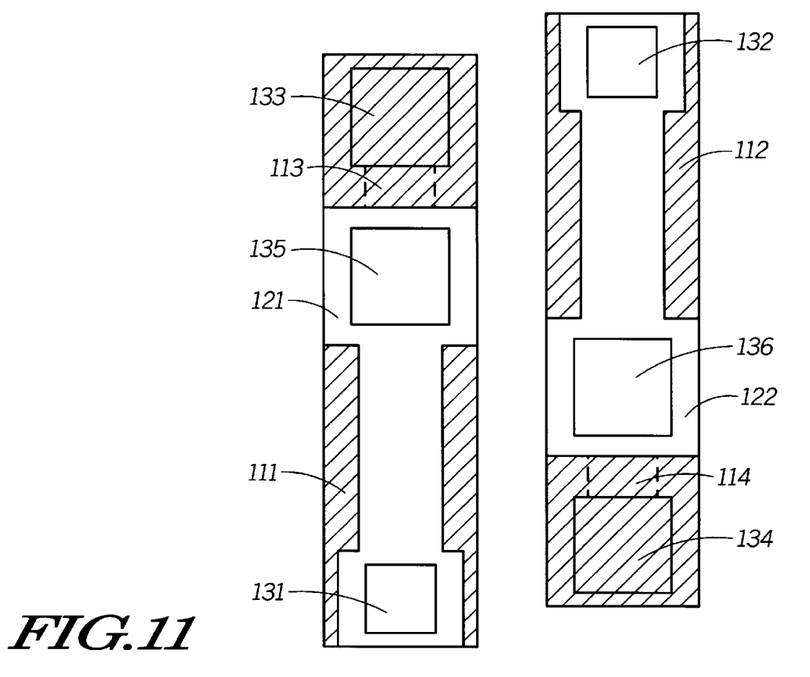

A second insulating layer (not shown) is formed over the members 121 and 122 and the substrate. The openings 131–136 are formed and extend to members 111, 112, 121, and 122 as shown in FIG. 11. Openings 131 and 132 are locations where a vertically offset channel section will be formed. Openings 131 and 132 are about 0.5 micron wide, and openings 133–136 are about 0.8 micron wide. Although the specific dimensions for the openings are given, the present invention is not limited to those dimensions. A subsequently formed silicon layer will fill the openings 131 and 132. Openings 131 and 132 should have a width that is no more than about twice the thickness of the subsequently formed silicon layer. Openings 133–136 are not to be filled, and openings 133–136 should have a width that is at least about twice the thickness of the subsequently formed silicon layer. Openings 131 and 132 may have different widths as may openings 133–136. Any width of opening can be used as long as the width of an opening meets its criterion related to the width with respect to the subsequently formed silicon layer. Although openings 131–136 are illustrated as being rectilinear, some rounding of the corners may occur during the patterning sequence.

Figure 12:
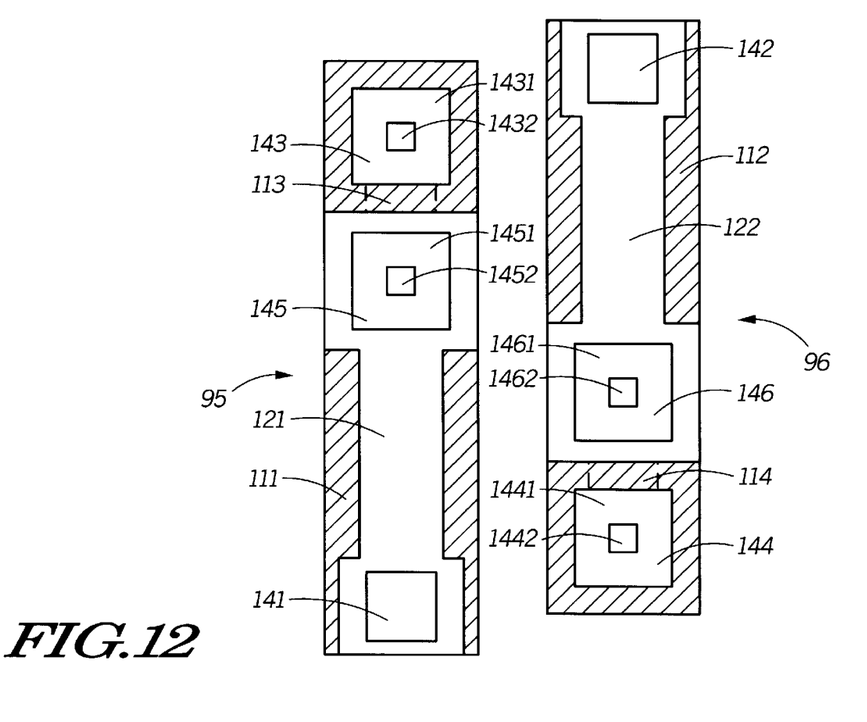

Plugs 141–146 are formed within openings 131–136, respectively, as shown in FIG. 12. Plugs 141 and 142 contain silicon but not tungsten, and plugs 143–146 have a silicon portion 1431, 1441, 1451, and 1461 and a tungsten portion 1432, 1442, 1452, and 1462. Plugs 141 and 142 have sections that are virtually free of dopant and forms the offset channel sections for the load transistors 95 and 96, respectively. The offset channel sections within plugs 141 and 142 have a length that is generally perpendicular to members 121 and 122 that include the main channel sections. The combination of the silicon and tungsten portions within the plugs 143–146 make the plugs conductive and provide an electrical connection to underlying silicon members.

Plugs 141–146 that have just been described are formed using a process sequence that follows. A fourth silicon layer about 3000 angstroms thick is deposited on the second insulating layer and within openings 131–136. Portions of the fourth silicon layer are heavily doped with a p-type dopant and annealed to activate and diffuse the dopant. A tungsten layer about 1500 angstroms thick is formed over the fourth silicon layer. The thickness of the tungsten layer may be varied, but should be thick enough such that openings that were not filled by the fourth silicon layer are filled by the tungsten layer. The tungsten layer is etched back to expose the fourth silicon layer, but still keep portions of the tungsten layer within the plugs 143–146. The fourth silicon layer is etched back to remove the portion of the fourth silicon layer that lies on the second insulating layer while keeping portions of the fourth silicon layer within plugs 141–146.

Figure 13:
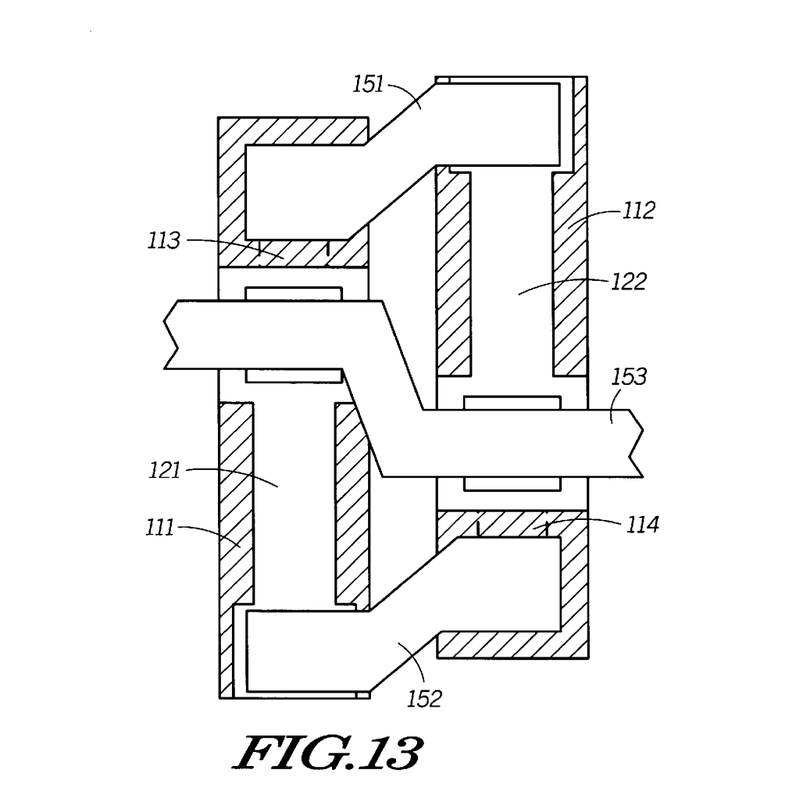

After forming plugs 141–146, a conductive layer is deposited over the substrate including the plugs 141–146. The conductive layer is patterned to form interconnects 151–153 as shown in FIG. 13. Interconnect 151 contacts plugs 142 and 143, and interconnect 152 contacts plugs 141 and 144. Interconnects 151 and 152 act as straps that connect the drain region of one load transistor to the gate electrode of the other load transistor. Interconnect 153 contacts plugs 145 and 146, and is electrically connected to $V_{DD}$. Other electrical connections (not shown) including word line, bit line, and $V_{SS}$ connections are made to various parts of the SRAM cell and a passivation layer (not shown) is formed over the SRAM cell to form a substantially finished SRAM cell.

Figure 14:
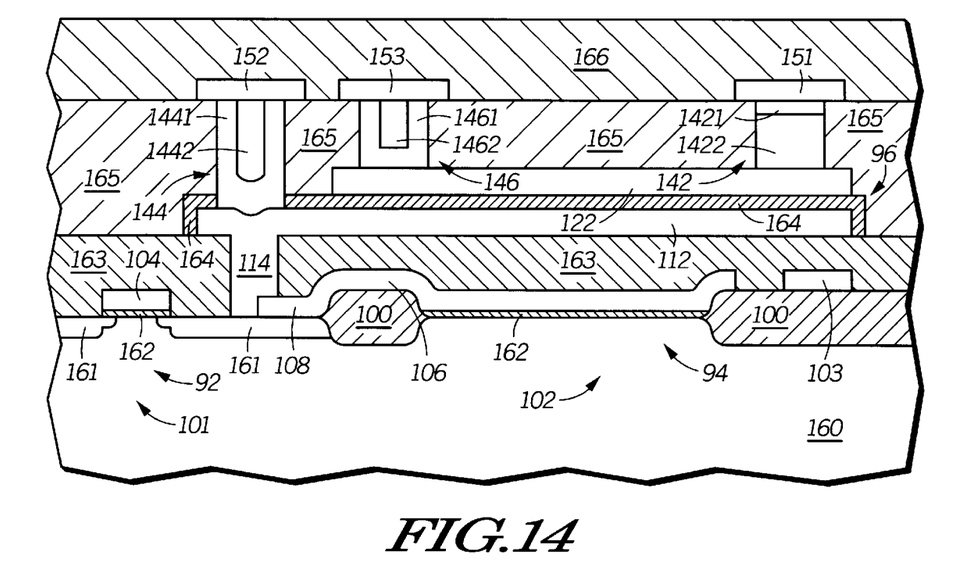
FIG. 14 includes a cross-sectional view of the SRAM cell of FIG. 13 after a passivation layer has been formed.

FIG. 14 includes a cross-sectional view of a portion of the substantially finished SRAM cell. FIG. 8 indicates where the cross-sectional view of FIG. 14 is seen. A lightly doped p-type semiconductor substrate 160 has field isolation regions 100 and active regions 101 and 102 that are defined by those field isolation regions 100. Active region 101 has heavily doped regions 161 that act as source/drain regions for pass transistor 92. Active region 102 has heavily doped regions similar to regions 161 but are not shown in FIG. 14. A first gate dielectric layer 162 overlies portions of the active regions. Members 103, 104, and 106 include the first silicon layer. Member 104 acts as the gate electrode for the pass transistor 92. Those portions of member 106 that comes into direct contact with region 161 is the buried contact 108. Member 106 acts as the gate electrode of latch transistor 94.

The first insulating layer 163 has member 112 lying on it and within an opening in the first insulating layer 163. That portion of the member 112 that contacts member 106 and region 161 forms the shared contact 114. It is noted that the shared contact 114 may not be drawn to scale due to constraints of the cross-sectional view. The second gate dielectric layer 164 lies at member 112. Member 122 lies on the second gate dielectric layer 164 and acts as the main channel section of the channel region of load transistor 96. The second insulating layer 165 overlies the substrate 160 including member 122. As can be better seen in the cross-sectional view, plugs 144 and 146 include silicon portions 1441 and 1461 and tungsten portions 1442 and 1462. Plug 142 includes silicon but not tungsten because plug 142 has a width that is relatively narrow compared to the width of plugs 144 and 146. Plug 142 includes a heavily doped region 1421 and a region 1422 that is either not doped or lightly doped. Region 1421 acts as the drain region for load transistor 96, and region 1422 acts as the offset channel section of the channel region of the load transistor 96. It is noted that silicon portions 1441 and 1461 have doping profiles that are similar to the right-hand plug of a previous embodiment shown in FIG. 5. The doping profile of the silicon portions 1441 and 1461 are not shown in FIG. 14 to reduce the likelihood of confusion. FIG. 14 also includes the interconnects 151–153 and the passivation layer 166. Other electrical connections for word lines, bit lines, and $V_{SS}$ are not shown.

Figure 15:
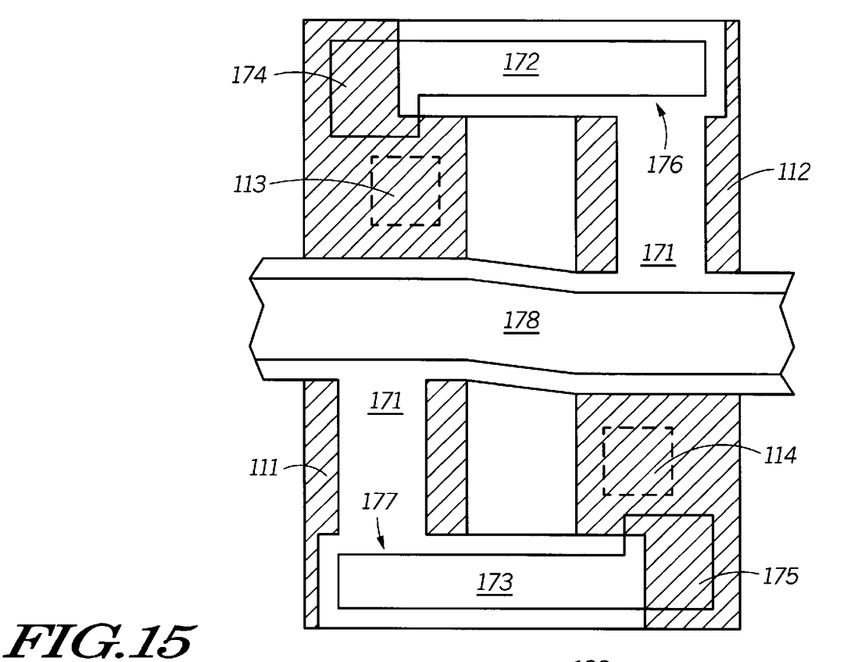
FIGS. 15 and 16 include top views of a semiconductor substrate illustrating a process for forming an SRAM cell with a thin-film transistor having an offset channel section in accordance with an embodiment the present invention.
Figure 16:
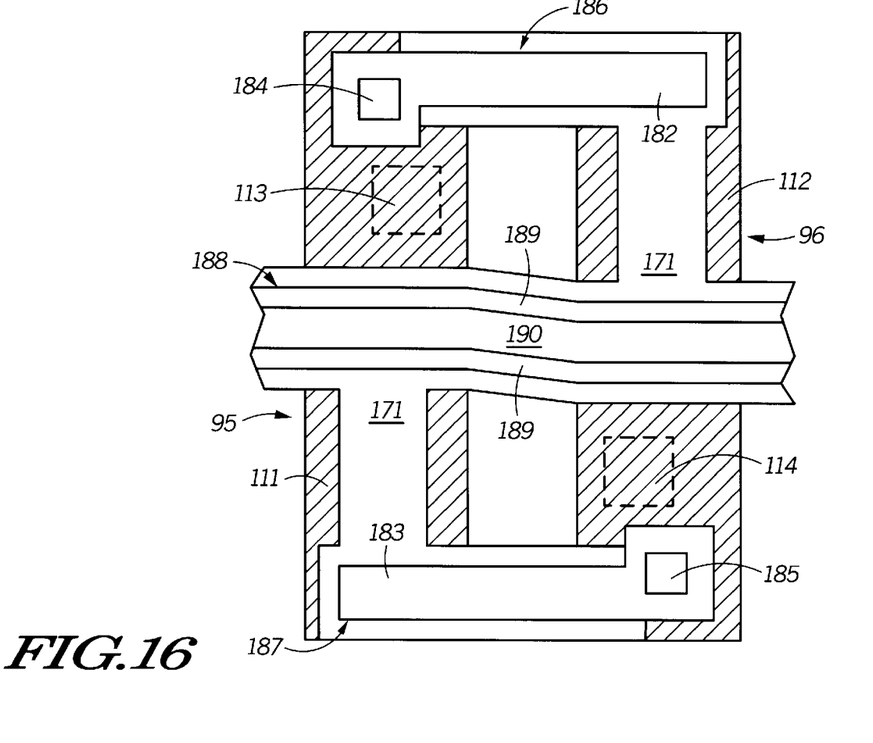

FIGS. 15 and 16 illustrate another embodiment of an SRAM cell. The processing of the SRAM cell is substantially the same as illustrated and described in reference FIGS. 8 and 9 of the previous embodiment. A second gate dielectric layer (not shown) is formed over the members 111 and 112. A third silicon layer about 200–2000 angstroms thick is deposited over the substrate including the second gate dielectric layer. The third silicon layer is patterned to form member 171 as shown in FIG. 15. Member 171 forms part of the active regions of subsequently formed load transistors 95 and 96. Member 171 is not electrically connected to the underlying members 111 and 112 at this point in the process. Some of the portions of the member 171 that will not be doped to form a source or drain region will be the main channel sections of the channel regions of the subsequently formed load transistors 95 and 96.

A second insulating layer (not shown) is formed over the member 171 and the substrate. The second insulating layer is patterned to form openings 176–178 as shown in FIG. 15. Opening 176 includes a relatively narrow and long section 172 and a relatively wide and short section 174, and opening 177 includes a relatively narrow and long section 173 and a relatively wide and short section 175. Opening 178 is relatively wide and long. Each of sections 172 and 173 is about 0.5 micron wide and exposes portions of member 171. Each of sections 174 and 175 are about 0.8 micron wide and exposes portions of members 171 and a portion of either member 111 or member 112. Opening 178 is about 0.8 micron wide and exposes a portion of member 171.

Although the specific dimensions for the openings are given, the present invention is not limited to those dimensions. A subsequently formed silicon layer will fill the sections 172 and 173. Sections 172 and 173 should have a width that is no more than about twice the thickness of the subsequently formed silicon layer. Sections 174 and 175 and opening 178 are not to be filled and should have a width that is at least about twice the thickness of the subsequently formed silicon layer. Sections 172 and 173 may have different widths as may sections 174 and 175 and opening 178. As long as the width of a section or opening meets its criterion with respect to the subsequently formed silicon layer, that width of opening can be used. Although openings 176–178 are illustrated as being rectilinear, some rounding of the corners may occur during the patterning sequence.

A fourth silicon layer about 3000 angstroms thick is deposited on the second insulating layer and within openings 176–178. Portions of the fourth silicon layer are heavily doped with an p-type dopant and annealed to activate and diffuse the dopant. A tungsten layer about 1500 angstroms thick is formed over the fourth silicon layer. The tungsten layer is etched back to expose the fourth silicon layer, but still keep portions of the tungsten layer within the sections 174 and 175 and opening 178. The fourth silicon layer is etched back to remove portions of the fourth silicon layer that lie on the second insulating layer while keeping portions of the fourth silicon layer within openings 176–178. The resulting structure forms plugs 186–188 as seen in FIG. 16. Plug 186 is formed within opening 176 and includes a silicon portion 182 from the fourth silicon layer and a tungsten portion 184 from the tungsten layer. Plug 187 is formed within opening 177 and also includes a silicon portion 183 and a tungsten portion 185. Plug 188 is formed within opening 178 and includes silicon portions 189 and a tungsten portion 190.

Figure 17:
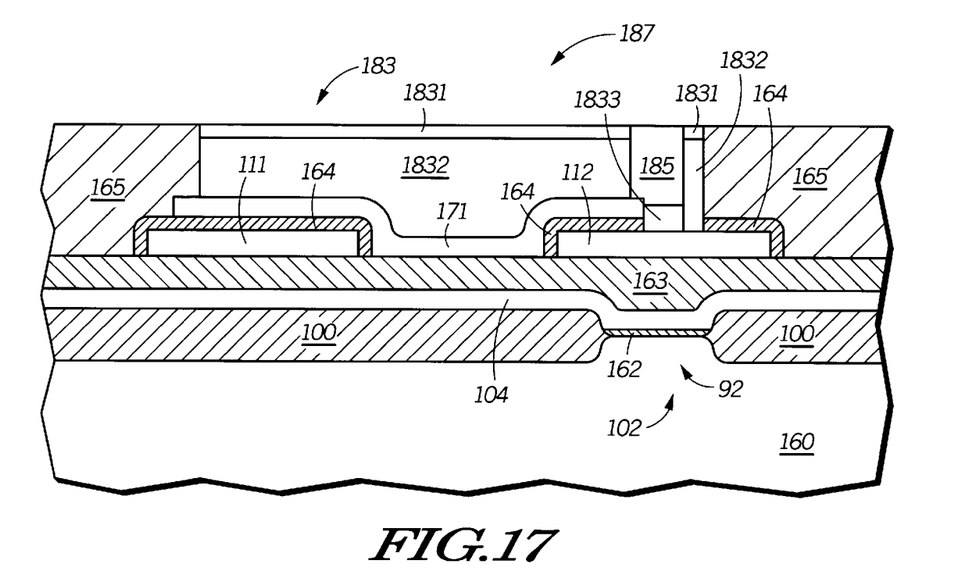
FIG. 17 includes a cross-sectional view of the SRAM cell of FIG. 16 after a passivation layer has been formed.

FIG. 17 includes a cross-sectional view of the SRAM cell at this point in the process. FIG. 8 indicates where the cross-sectional view of FIG. 17 is seen. A lightly doped p-type semiconductor substrate 160 has field isolation regions 100 and active region 102. Active region 102 has heavily doped regions but are not shown in FIG. 17. A first gate dielectric layer 162 overlies portions of the active regions. Member 104 is formed from the first silicon layer and acts as a gate electrode for the pass transistor 92. The first insulating layer 163 overlies the member 104, and silicon members 111 and 112 lies on the first insulating layer 163. The second gate dielectric layer 164 is adjacent to member 111 and 112. A portion of the second gate dielectric layer 164 has been removed from a portion of member 112, so that plug 187 contacts member 112. The second insulating layer 165 overlies the substrate 160 including portions of members 111 and 112.

FIG. 17 includes the plug 187 that includes the silicon portion 183 and the tungsten portion 185. The silicon portion 183 includes regions 1831–1833. Regions 1831 and 1833 are relatively heavily doped, and region 1832 is either undoped or lightly doped. Region 1832 acts as the offset channel section for one of the load transistors. The combination of the regions 1831 and 1833 and tungsten portion 185 provide an electrical connection between the region 1832 and the member 112 that acts as the gate electrode for the other load transistor.

The operation of the load transistors of the SRAM cell of this embodiment is illustrated by an example wherein data has already been written such that member 111 is at a relatively low potential and member 112 is at a relatively high potential. Member 111 and 112 act as the gate electrodes for the load transistors. Referring to FIG. 16, holes flow from $V_{DD}$ via plug 188 that acts as a common source region for the load transistors 95 and 96. Load transistor 95 is on and allows holes to flow because member 111 is at a relatively low potential, and load transistor 96 is off and allows little, if any, holes to flow because member 112 is at a relatively high potential. Holes flow through the lower left-hand portion of member 171, which acts as the main channel section of load transistor 95, towards the plug 187. Region 1832 allows current to flow vertically and laterally through it as seen in FIG. 17. Region 1832 can be thought of as having a vertical resistance and a lateral resistance that are electrically parallel to one another. Assuming that region 1832 is about 2000 angstroms thick over member 111 and the region 1832 has a lateral dimension of about 0.8 micron, about 80 percent of all current flowing through region 1832 will flow in the vertical direction, and about 20 percent will flow in the lateral direction. Therefore, region 1832 acts as an offset channel section that has a length that is generally in the vertical direction because the current flow through region 1832 is primarily vertical. Region 1833 and tungsten portion 185 are relatively conductive and add little resistance compared to region 1832.

The SRAM cell shown in FIG. 17 is further processed to form a substantially completed device. The processing, layers, and interconnects are similar to those shown or described in the previous SRAM cell embodiment.

As seen in FIGS. 14 and 17, both SRAM embodiments have an offset channel section of the channel region that is in the vertical direction as opposed to a lateral direction. By utilizing the vertical direction, the offset channel section does not occupy additional substrate area. Because less substrate area is occupied, contacts to $V_{SS}$, bit lines, or word lines are not as complicated as they may be for a prior art device with an offset drain region that typically has a length that includes a lateral component. The simplicity in which the offset channel section is incorporated is an additional benefit. The offset drain region of the prior art may require an additional masking layer.

A number of other embodiments may be used in forming the plugs 141–146 or 186–188. The silicon portions of the plugs may be replaced by or used in conjunction with another semiconductor material including silicon, germanium, diamond, and the like. The tungsten portions of the plugs may be replace by any conductive material including heavily doped silicon, metals, and metal-containing compounds. The tungsten portions are not required. Subsequently formed interconnects may have a portion that extends down to the silicon portions of the plugs. Although the insulating layers are shown as being planarized, they do not have to be planarized. The length of the offset channel sections of the channel regions of the load transistors 95 and 96 are determined in part by the thickness of the second insulating layer 165 and how far the p-type dopant diffuses from the top of the fourth silicon layer. The regions 1422 and 1832, which act as offset channel sections, have length typically between about 200–5000 angstroms long. More specifically, the offset channel sections are usually between about 1000–3000 angstroms long.

Chemical-mechanical polishing may be used to remove the portions of the fourth silicon and tungsten layers overlying the second insulating layer rather than the etching. If chemical-mechanical polishing is used, the second insulating layer 165 may need to be planarized prior to depositing the fourth silicon and tungsten layers. The openings 131–136 or 176–178, the fourth silicon layer, and the tungsten layer are formed as described above. Instead of etching, the substrate including the fourth silicon and tungsten layers is polishing using a conventional chemical-mechanical polishing method. The polishing removes that portion of the fourth silicon and tungsten layers lying outside of the openings 131–136 or 176–178 to form the plugs 141–146 or 186–188.

Needless to say, many processing options exist for the SRAM cells. Specific thicknesses, dimensions, and dose or doping levels may be changed. Conductivity types may be reversed. All possible processing options would be nearly impossible to list. Many of the processing options available to the single transistor embodiment may be used with the SRAM cell.

In the foregoing specification, the invention has been described with reference to specific embodiments thereof. However, it will be evident that various modifications and changes made thereto without departing from the broader spirit or scope of the invention as set forth in the appended claims. Accordingly, the specification and drawings are to be regarded in an illustrative rather than a restrictive sense.

What is claimed is:

1. A field-effect transistor comprising;
   a gate electrode over a substrate;
   a gate dielectric layer over the gate electrode;
   a semiconductor layer over the gate dielectric layer;
   an insulating layer including a first opening and a second opening over the semiconductor layer, wherein:
      each of the first and second openings has a bottom and a top;
      the first opening has a first width; and
      the second opening has a second width that is wider than the first width;
   a first semiconductor portion that lies within first opening and overlies the semiconductor layer, wherein:
      the first semiconductor portion has a first region and a second region;
      the first region is heavily doped and lies adjacent to the top of the first opening; and
      the second region is not heavily doped and lies adjacent to the bottom of the first opening;
   a second semiconductor portion that lies within second opening and overlies the semiconductor layer, wherein:
      the second semiconductor portion has a first region and a second region;
      the first region is heavily doped and lies adjacent to the top of the second opening; and
      the second region is heavily doped and lies adjacent to the bottom of the second opening.

2. The field-effect transistor of claim 1, wherein the second region of the first semiconductor portion acts as a channel offset section having a length in a range of 200–5000 angstroms.

3. The field-effect transistor of claim 1, further comprising a conductive layer that electrically connects the first and second regions of the second semiconductor portion.

4. The field-effect transistor of claim 1, further comprising:
   a first interconnect overlying and electrically connected to the first region of the first semiconductor portion; and
   a second interconnect overlying and electrically connected to the first and second region of the second semiconductor portion.

5. The field-effect transistor of claim 1, wherein:
   the first region of the first semiconductor portion acts as a drain region of the field-effect transistor; and
   the second region of the second semiconductor portion acts as a source region of the field-effect transistor.

6. The field-effect transistor of claim 1, wherein the semiconductor layer includes n-type doped silicon having a thickness in a range of 200–2000 angstroms.

7. A field-effect transistor comprising:
   a gate electrode over a substrate;
   a gate dielectric layer over the gate electrode;
   a semiconductor layer over the gate dielectric layer;
   an insulating layer including a first opening and a second opening over the first semiconductor layer, wherein:
      each of the first and second openings has a bottom and a top;
      the first opening has a first width; and
      the second opening has a second width that is wider than the first width;
   a first semiconductor portion that lies within first opening and overlies the semiconductor layer, wherein:
      the first semiconductor portion has a first region and a second region;
      the first region is heavily doped and lies adjacent to the top of the first opening;
      the second region is not heavily doped and lies adjacent to the bottom of the first opening; and
      the first semiconductor portion does not overlies the insulating layer;
   a second semiconductor portion that lies within second opening and overlies the semiconductor layer, wherein:
      the second semiconductor portion has a first region and a second region;
      the first region is heavily doped and lies adjacent to the top of the second opening;
      the second region is heavily doped and lies adjacent to the bottom of the second opening; and
      the second semiconductor portion does not overlie the insulating layer; and
   a contact plug that only lies within the second opening.

8. The field-effect transistor of claim 7, wherein the second region of the first semiconductor portion acts as a channel offset section having a length in a range of 200–5000 angstroms.

9. The field-effect transistor of claim 7, wherein:
   the first region of the first semiconductor portion acts as a drain region of the field-effect transistor; and
   the second region of the second semiconductor portion acts as a source region of the field-effect transistor.

10. The field-effect transistor of claim 7, wherein the semiconductor layer includes n-type doped silicon having a thickness in a range of 200–2000 angstroms.

11. The field-effect transistor of claim 7, wherein the first region of the first semiconductor portion and the first and second regions of the second semiconductor portion includes p-type doped silicon.

12. The field-effect transistor of claim 7, wherein the conductive layer includes a material selected from a group consisting of tungsten and heavily doped silicon.

13. A static-random-access memory cell comprising:
   field isolation regions within a semiconductor substrate that define active regions;
   a first gate dielectric layer over the active regions;
   first conductive members over the first gate dielectric layer, wherein the first conductive members act as gate electrodes for pass and latch transistors of the static-random-access memory cell;
   a first insulating layer over the first conductive members, wherein the first insulating layer includes first insulating layer openings, and wherein each of the first insulating layer openings extends through the first insulating layer to a location selected from a group consisting of one of the first conductive members and one of the active regions;
   second conductive members over the first insulating layer and within the first insulating layer openings;
   a second gate dielectric layer over the second conductive members;
   a first semiconductor member and a second semiconductor member over the second gate dielectric layer, wherein;
      a length of each of the first and second semiconductor members is parallel to a length of one of the second conductive members; and
      each of the first and second semiconductor members has a first end and a second end;
   a second insulating layer including first, second, third, and fourth openings over the first and second semiconductor members, wherein:

each of the first, second, third, and fourth openings has a bottom and a top;

the first opening of the second insulating layer has a first width and is adjacent to the first end of the first semiconductor member;

the second opening of the second insulating layer has a second width that is wider than the first width and is adjacent to the second end of the first semiconductor member;

the third opening of the second insulating layer has the first width and is adjacent to the first end of the second semiconductor member;

the fourth opening of the second insulating layer has the second width and is adjacent to the second end of the second semiconductor member;

a first semiconductor portion that lies within first opening of the second insulating layer and overlies the first semiconductor member, wherein:

the first semiconductor portion has a first region and a second region;

the first region is heavily doped and lies adjacent to the top of the first opening of the second insulating layer; and the second region is not heavily doped and lies adjacent to the bottom of the first opening of the second insulating layer;

a second semiconductor portion that lies within second opening of the second insulating layer and overlies the first semiconductor member, wherein:

the second semiconductor portion has a first region and a second region;

the first region is heavily doped and lies adjacent to the top of the second opening of the second insulating layer;

the second region is heavily doped and lies adjacent to the bottom of the second opening of the second insulating layer;

a third semiconductor portion that lies within third opening of the second insulating layer and overlies the second semiconductor member, wherein:

the third semiconductor portion has a first region and a second region;

the first region is heavily doped and lies adjacent to the top of the third opening of the second insulating layer;

the second region is not heavily doped and lies adjacent to the bottom of the third opening of the second insulating layer;

a fourth semiconductor portion that lies within fourth opening of the second insulating layer and overlies the second semiconductor member, wherein:

the fourth semiconductor portion has a first region and a second region;

the first region is heavily doped and lies adjacent to the top of the fourth opening of the second insulating layer;

the second region is heavily doped and lies adjacent to the bottom of the fourth opening of the second insulating layer; and conductive portions, wherein.

one of the conductive portions lies within the second opening of the second insulating layer;

another one of the conductive portions lies within the fourth opening of the second insulating layer; and none of the conductive portions lies within each of the first and third opening of the second insulating layer openings of the second insulating layer.

14. The static-random-access memory cell of claim 13, wherein:

the first and second semiconductor members include n-type doped silicon;

the first regions of the first and third semiconductor portions and the first and second regions of the second and fourth semiconductor portions include p-type doped silicon; and a combination of the following forms load transistors for the memory cell:

the second conductive members;

the second gate dielectric layer;

the first and second semiconductor members; and the first, second, third, and fourth semiconductor portions and conductive portions that lie within the first, second, third, and fourth openings of the second insulating layer.

15. The static-random-access memory cell of claim 13, wherein the second regions of the first and third semiconductor portions act as channel offset sections each having a length in a range of 200–5000 angstroms.

16. The static-random-access memory cell of claim 13, wherein the conductive portions include a material selected from a group consisting of tungsten and heavily doped silicon.

17. The static-random-access memory cell of claim 13, wherein:

the first regions of the first and third semiconductor portions act as drain regions of load transistors; and the second regions of the second and fourth semiconductor portions act as source regions of the load transistors.

18. The static-random-access memory cell of claim 13, further comprising an interconnect, wherein the interconnect overlies the second and fourth opening of the second insulating layer openings of the second insulating layer.

* * * * *